(12) United States Patent
Shin et al.

(10) Patent No.: US 7,282,969 B2
(45) Date of Patent: Oct. 16, 2007

(54) LOW DIVIDE RATIO PROGRAMMABLE FREQUENCY DIVIDER AND METHOD THEREOF

(75) Inventors: Sung Cheol Shin, Seoul (KR); Yoo Hwan Kim, Kyungki-do (KR); Ki Sung Kwon, Seoul (KR); Soo Woong Lee, Kyungki-do (KR); Jin Taek Lee, Kyungki-do (KR); Yo Sub Moon, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 11/380,917

(22) Filed: Apr. 28, 2006

(65) Prior Publication Data

US 2006/0284654 A1    Dec. 21, 2006

(30) Foreign Application Priority Data

Jun. 21, 2005    (KR)  ................ 10-2005-0053489

(51) Int. Cl.
*H03K 21/00*    (2006.01)
(52) U.S. Cl. .................................. 327/115; 327/117
(58) Field of Classification Search ............... 327/117, 327/115, 113; 377/47, 48, 49; 331/177 R
See application file for complete search history.

(56) References Cited

U.S. PATENT DOCUMENTS 6,219,397 B1    4/2001    Park ........................ 375/376
6,369,623 B1 *  4/2002    Heinen .................... 327/117

* cited by examiner

*Primary Examiner*—Linh My Nguyen
(74) *Attorney, Agent, or Firm*—Lowe Hauptman Ham & Berner (57) ABSTRACT

The invention provides a low divide ratio programmable frequency divider of a fractional-N type applied to a digital MOPLL tuner and a method thereof. In the invention, a divide ratio assigner assigns divide data as a main divide ratio and a pulse swallow value according to a first or a second dividing operation mode in response to a mode selection signal. A prescaler operates on the first or second divide operation mode in response to the mode selection signal. Also, a main counter divides a frequency from the prescaler by the main divide ratio. Further, a pulse swallow counter counts a clock of the main counter while outputting a pulse swallow signal to the prescaler. The pulse swallow signal has a swallow level if a counting value corresponds to the pulse swallow value, and a non-swallow level if the counting value does not correspond to the pulse swallow value.

17 Claims, 9 Drawing Sheets

PRIOR ART

LOW DIVIDE RATIO PROGRAMMABLE FREQUENCY DIVIDER AND METHOD THEREOF

CLAIM OF PRIORITY

This application claims the benefit of Korean Patent Application Ser. No. 2005-53489 filed on Jun. 21, 2005 in the Korean Intellectual Property Office, the disclosure of which is incorporated herein by reference.

BACKGROUND OF THE INVENTION

1. Field of the Invention

The present invention relates to a low divide ratio programmable frequency divider of a fractional-N type applied to a digital Mixer Oscillator Phaselocked Loop (MOPLL) tuner and a method thereof. More particularly, the present invention relates to a low divide programmable frequency divider which can operate at a higher comparison frequency with a lowered main divide ratio, and thereby can be improved in phase noise properties and scaled down.

2. Description of the Related Art

In general, for a frequency synthesizer generating an oscillation frequency Fvco, a variable oscillator and a Phase Locked Loop (PLL) are employed. The variable oscillator multiplies, diminishes or mixes the oscillation frequency based on a highly stable crystal oscillator (X-tal) to oscillate a predetermined frequency. The PLL controls a phase of the variable oscillator.

Figure 1:
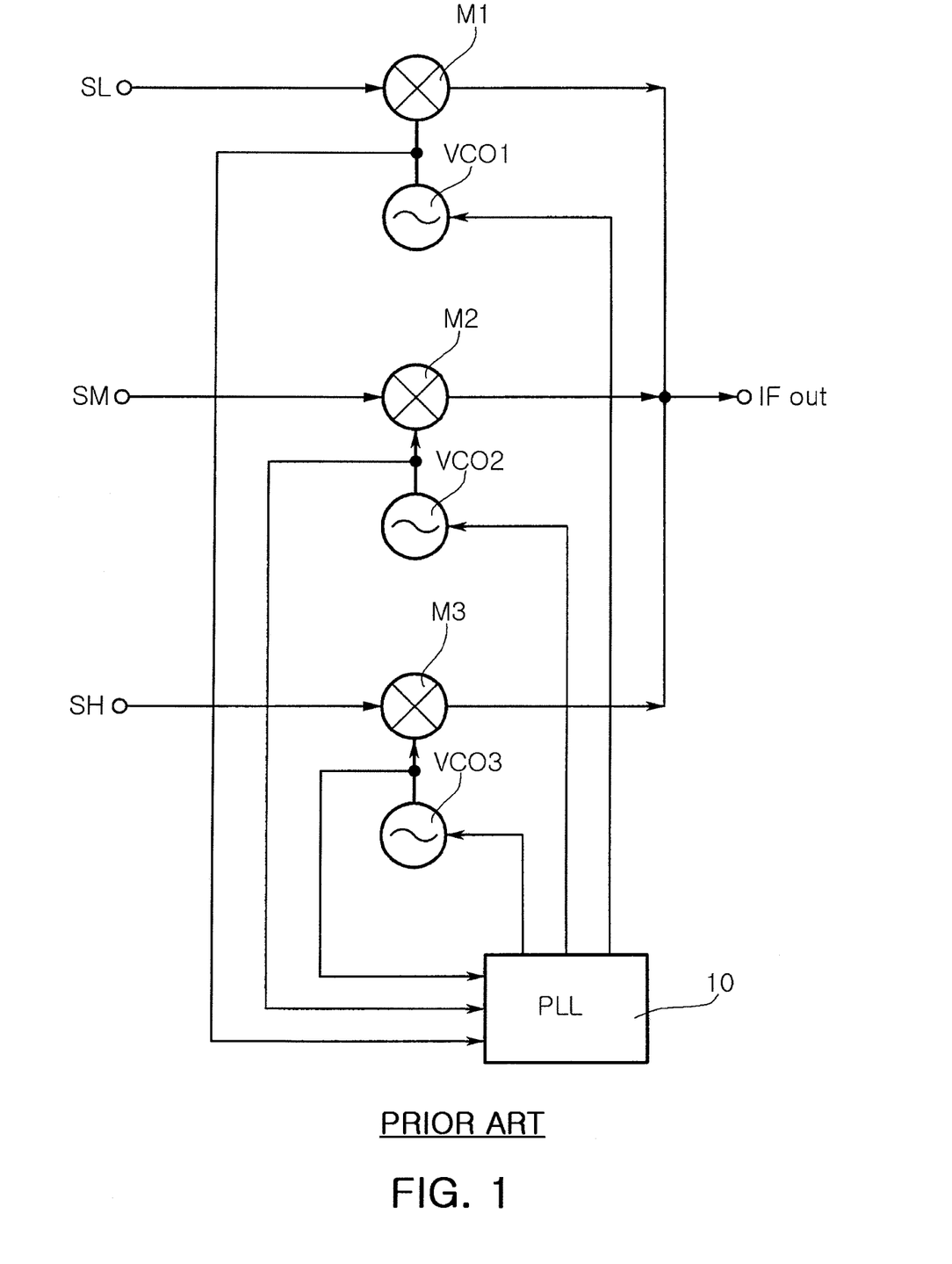
FIG. 1 is a sectional view of a frequency synthesizer according to the prior art.

FIG. 1 is a sectional view of a frequency synthesizer according to the prior art.

The conventional frequency synthesizer shown in FIG. 1, when applied to a digital MOPLL tuner, includes a plurality of mixers M1-M3 for mixing input signals SL, SM and SH including VHF-L, VHF-H and UHF bands with oscillation frequencies to output an intermediate frequency signal IFout, a plurality of oscillators VCO1-VCO3 for providing the oscillation frequencies to the mixers M1-M3, and a multiband PLL 10 for controlling each of the oscillators VCO1-VCO3.

When employed in the digital MOPLL tuner for receiving a digital TV signal, such a frequency synthesizer is required to have a high channel selectivity within a range that satisfies noise properties such as phase noise and sideband spurious in consideration of channel spacing.

The PLL used for the frequency synthesizer is largely broken down into an integer-N PLL and a fractional-N PLL. In particular, advantageously, the fractional-N PLL exhibits low phase noise properties.

Characteristically, the fractional-N PLL entails fractional spurious necessarily. In the most widely-known noise shaping method for inhibiting such fractional spurious, a discrete sigma-delta ($\Sigma\Delta$) modulator is adopted. The sigma-delta modulator shifts fractional spurious out of a loop bandwidth of the PLL in converting a low frequency noise into a high frequency noise.

To employ the sigma-delta modulator requires a divide ratio which varies more frequently within a broad variable range per divide cycle.

Of the conventional PLLs, the sigma-delta modulation-based factional-N PLL will be explained hereunder with reference to FIGS. 2 to 4.

Figure 2:
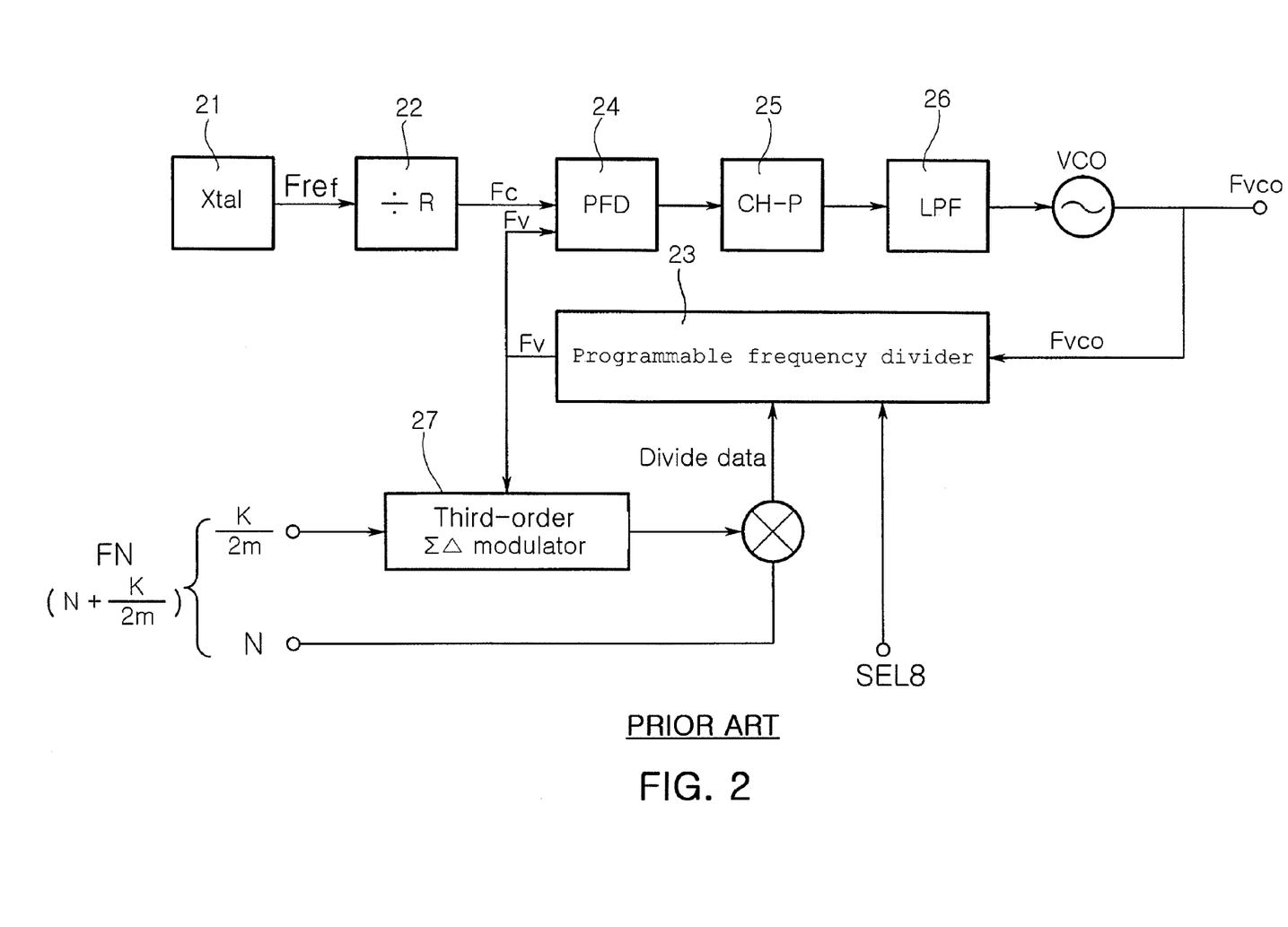
FIG. 2 is a configuration view illustrating a factional-N type PLL using a third Σ☐ modulation according to the prior art.

FIG. 2 is a configuration view illustrating a factional-N PLL using a third-order sigma-delta modulation of the prior art.

The conventional fractional-N PLL shown in FIG. 2 includes a reference divider 22 for dividing a reference frequency Fref from a reference frequency generator 21 by a reference divide ratio, a programmable frequency divider 23 for varying the divide ratio in response to a control signal inputted and dividing an oscillation frequency Fvco of a voltage control oscillator VC0 by the varied divide ratio, a phase difference detector 24 for detecting a phase difference between a comparison frequency Fc divided by the reference divider and a divide oscillation frequency Fv divided by the programmable frequency divider 23, a charge pump 25 for pumping a charge according to the phase difference from the phase difference detector 24 and supplying a voltage corresponding to the phase difference; and a low-pass filter 26 for low-passing the voltage from the charge pump 25 to stabilize and then supplying the same to the voltage control oscillator VCO as a tuning voltage VT.

Further, the frequency synthesizer employs a third-order sigma-delta modulator 27 which provides divide data to the programmable frequency divider 23 to vary the divide ratio. The third-order sigma-delta modulator 27 including an M bit accumulator inside receives K[M bit] corresponding to the numerator of the fractional section in fraction-N divide ratio ($FN=N+K/2^M$), and accumulates the K. At this time, the third $\Sigma\Delta$ modulator 27 generates carry in case where the accumulated value exceeds the denominator ($2^M$). Then the third $\Sigma\Delta$ modulator 27 outputs the resultant carry ($\Sigma\Delta$) and integer divide ratio N to the programmable frequency divider 23 as the divide data.

Figure 3:
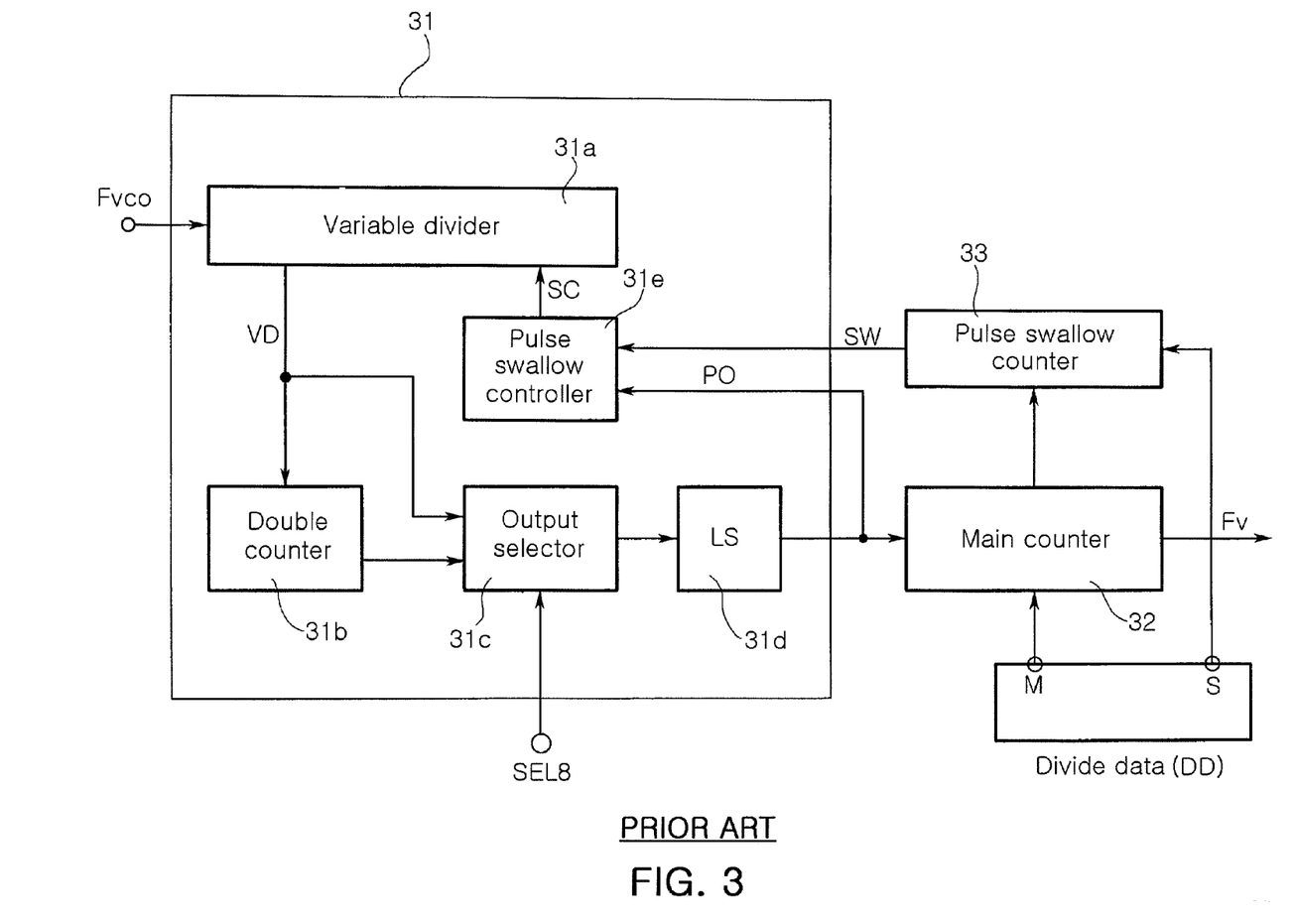
FIG. 3 is a configuration view illustrating a programmable frequency divider of FIG. 2.

FIG. 3 is a configuration view illustrating the programmable frequency divider of FIG. 2.

Referring to FIG. 3, the programmable divider 27 includes a prescaler 31, a main counter and a pulse swallow counter 33.

The prescaler 31 includes a variable divider 31a for dividing by 4 or 5 as pre-set in response to a swallow control signal SC, a double counter 31b for double-counting a frequency from the variable divider 31a to divide by 2, an output selector 31c for selecting the frequency Fvco/4 or Fvco/5 divided by 4 or 5 by the variable divider 31a or the frequency double-counted by the double counter 31c in response to a mode selection signal SEL8, a level converter 31d for converting an output frequency level of the output selector 31c into a full-swing level, and a pulse swallow controller 31e for out putting the swallow control signal SC to the variable divider 31c in response to an output signal PO from the level converter 31c and a swallow signal SW from the pulse swallow counter 33.

The main counter 32 divides the frequency divided by the prescaler 31 by a pre-set main divide ratio M to generate a divide oscillation frequency Fv. The pulse swallow counter 33 counts a clock from the main counter 32 and outputs "0" during the counting. Then, if a counting value corresponds to a pre-set pulse swallow value S, the pulse swallow counter 33 outputs the pulse swallow signal SW of "1" to the pulse swallow controller 31e of the prescaler 31.

This conventional programmable frequency divider operates on a divide-by-4/5 mode or a divide-by-8/9 mode in response to the mode selection signal SEL8. Also, the divide ratio in each mode varies in response to the pulse swallow signal SW, which will be explained with reference to FIGS. 4a and 4b.

Figure 4A:
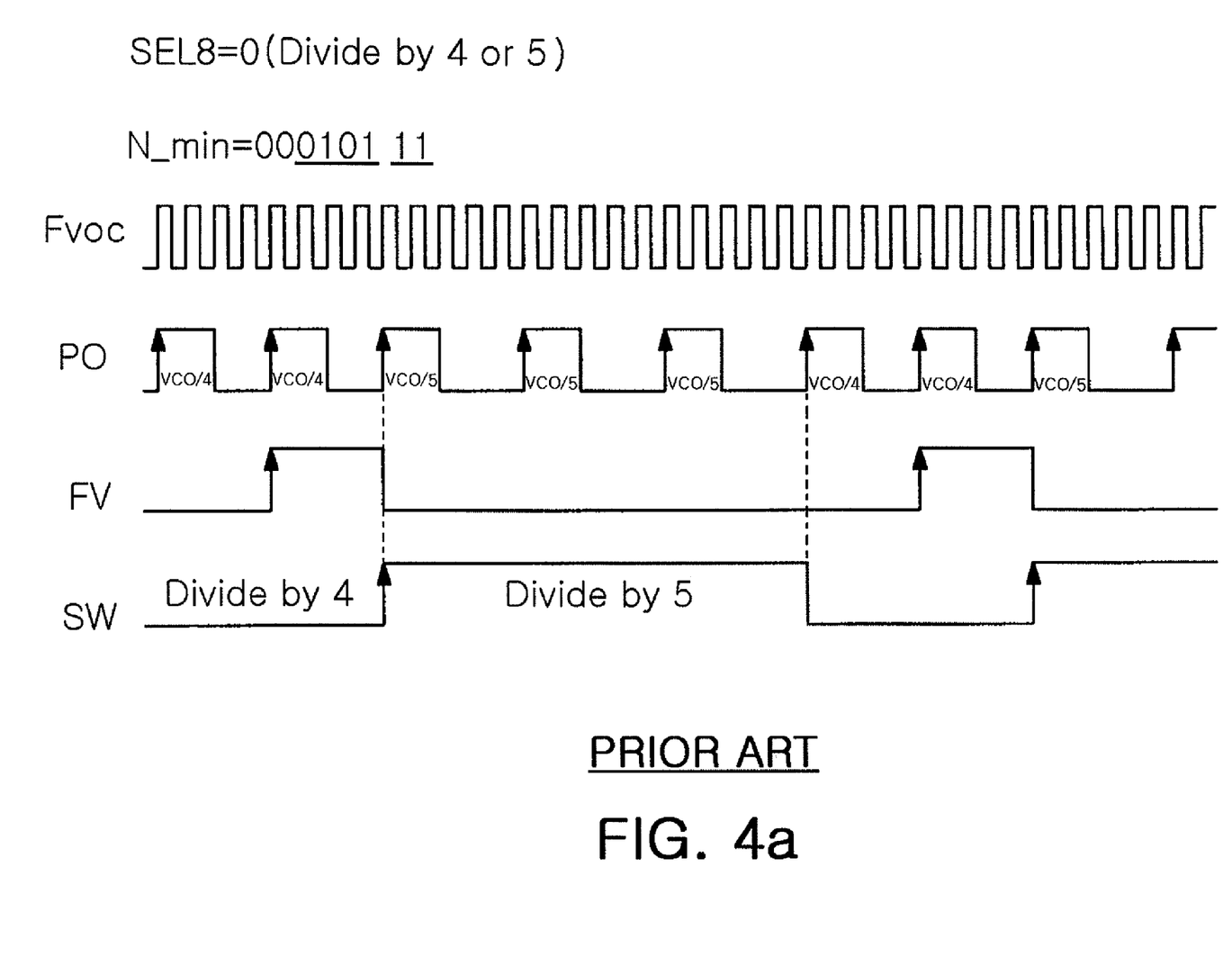
Figure 4B:
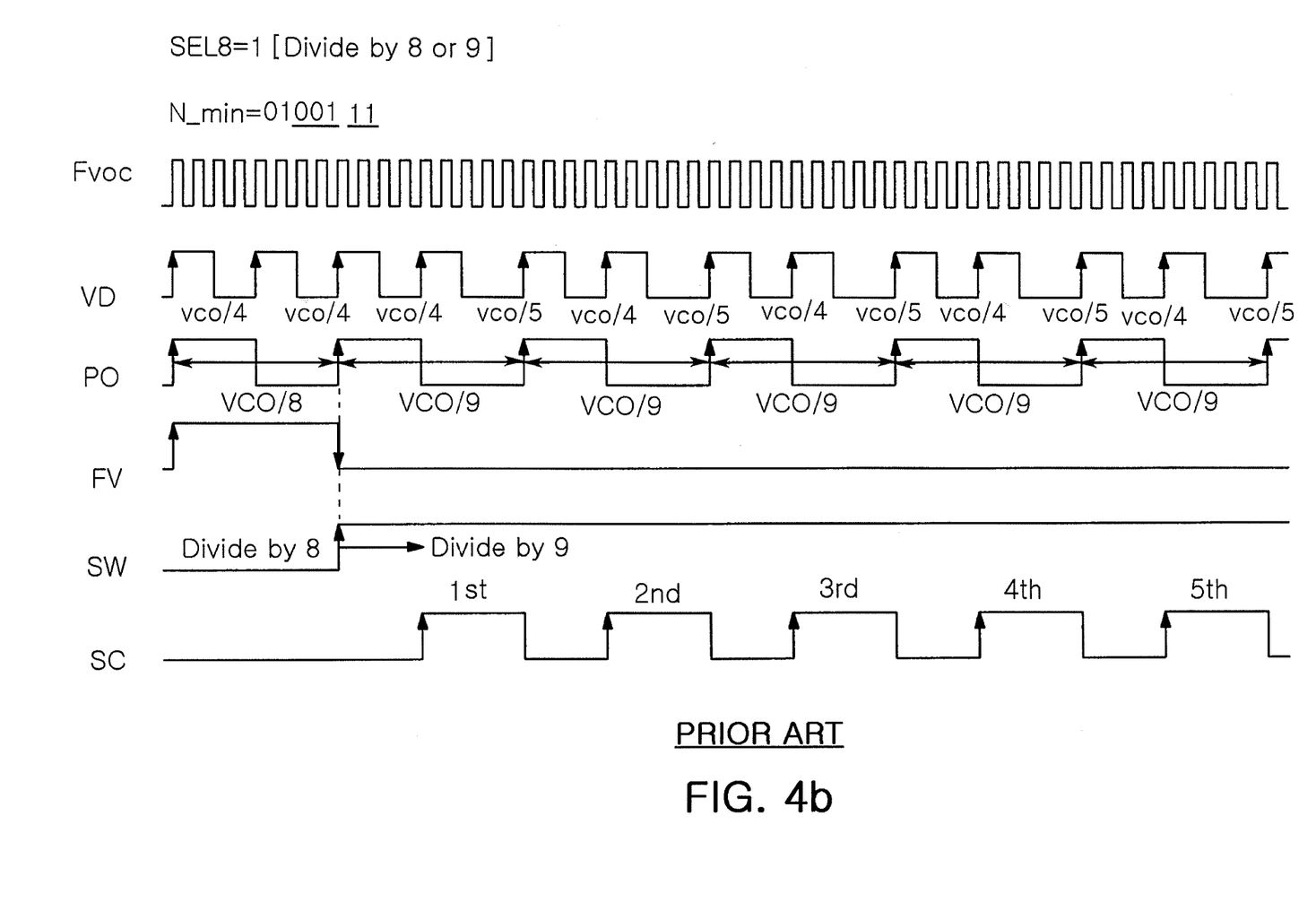

FIGS. 4a and 4b are flowcharts illustrating operation of the programmable frequency divider of FIG. 3.

First, with reference to FIG. 4a, an explanation will be given regarding a divide-by-4/5 mode in which the prescaler 31 divides the oscillation frequency Fvco by 4 or 5.

Referring to FIG. 4a, if the prescaler 31 divides the oscillation frequency Fvco by 4 or 5 in response to the pulse swallow signal SW of the pulse swallow counter 33, in case of the divide ratio of 1 byte (8bit:b8b7b6b5 b4b3b2b1), lowest 2 bits b2mb1 are assigned as the pulse swallow value S and the other bits (b8b7b6b5 b4b3) are assigned as the main divide ratio M. Herein, the prescaler executes a pulse swallow if the main divide ratio M corresponds to the pulse swallow value S. Therefore, the pulse swallow value S cannot be bigger than the main divide ratio M. In addition, a sigma-delta-induced negative number should be considered.

In this regard, a minimum divide ratio in the divide-by-4 or 5 mode is 20(0001 0100). At this time, a VCO output frequency is produced with each different reference frequency applied, at the minimum divide ratio according to following equation 1.

$$rm\ Fvco = Fref * FN \quad \text{Equation 1}$$

According to equation 1, in case where the divide ratio FN is 20 and the reference frequencies Fref are 4 MHz, 8 MHz and 16 MHz, the oscillation frequencies Fvco are 80 MHz (4 MHz*20), 160 MHz (8 MHz*20) and 320 MHz (16 MHz*20), respectively.

Then, with reference to FIG. 4b, an explanation will be given regarding a divide-by-8/9 mode in which the prescaler 31 divides the oscillation frequency Fvco by 8 or 9.

Referring to FIG. 4b, if the prescaler 31 divides the oscillation frequency Fvco by 8 or 9 in response to the pulse swallow signal SW of the pulse swallow counter 33 and the double counter, in case of the divide ratio of 1 byte (8 bits: b8b7b6b5 b4b3b2b1), lowest 3 bits (b3b2b1) are assigned as the pulse swallow value S and the other bits (b8b7b6b5 b4) are assigned as the main divide ratio M. Herein, as described above, the pulse swallow value S cannot be bigger than the main divide ratio M. Also, a sigma-delta-based negative numeral should be considered.

In this regard, the minimum divide ratio in a divide-by-8 or 9 mode is 72(0100 1000). At this time, the VCO output frequency is produced with each different reference frequency applied, at the minimum divide ratio according to aforesaid equation 1. According to equation 1, in case where the divide ratio FN is 72 and the reference frequencies Fref are 4 MHz, 8 MHz and 16 MHz, the oscillation frequencies Fvco are 288 MHz (4 MHz*72), 576 MHz (8 MHz*72) and 1152 MHz (16 MHz*72), respectively.

However, this conventional programmable frequency divider disadvantageously cannot employ a high reference frequency Xtal in the factional-N PLL directed at miniaturization and low phase noise.

As a result, the main counter should be assigned with a high main divide ratio, thus leading to degradation in phase noise properties and limitations in scaling down a reference frequency generator.

SUMMARY OF THE INVENTION

The present invention has been made to solve the foregoing problems of the prior art and it is therefore an object of the present invention to provide a fractional-N type low divide ratio programmable frequency divider applied to a digital MOPLL tuner which can be improved in phase noise properties and scaled down by operating at a high comparison frequency with a lowered main divide ratio, and a method thereof.

According to an aspect of the invention for realizing the object, there is provided a low divide ratio programmable frequency divider comprising: a divide ratio assigner for assigning divide data as a main divide ratio and a pulse swallow value according to a first divide operation mode or a second divide operation mode in response to a mode selection signal, wherein 2 bits of the divide data are assigned as the pulse swallow value; a prescaler for operating on the first divide operation mode or the second divide operation mode in response to the mode selection signal, dividing an oscillation frequency by N or N+1 in response to a pulse swallow signal in the first divide operation mode, and dividing the oscillation frequency by P, P+1 or P+2 in response to a lowest bit, a divide oscillation frequency, an output signal thereof and the pulse swallow signal in the second operation mode; a main counter for dividing a frequency from the prescaler by the main divide ratio; and a pulse swallow counter for counting a clock of the main counter while outputting the pulse swallow signal to the prescaler, the pulse swallow signal having a swallow level if a counting value corresponds to the pulse swallow value, and having a non-swallow level if the counting value does not correspond to the pulse swallow value.

The first divide operation mode comprises a 4/5 divide operation mode operating on a divide by 4 or 5, and the second divide operation mode comprises an 8/9/10 divide operation mode operating on a divide by 8,9, or 10.

The divide ratio assigner assigns lower 2 bits of the divide data as the pulse swallow value and the other bits as the main divide ratio if the mode selection signal corresponds to the first divide operation mode; and assigns higher 2 bits out of lower 3 bits of the divide data as the pulse swallow value and remaining bits other than the lower 3 bits as the main divide ratio if the mode selection signal corresponds to the second divide operation mode.

The prescaler operates on the divide by 4 if the mode selection signal corresponds to the first divide operation mode and the pulse swallow signal is non-swallow, and operates on the divide by 5 if the mode selection signal corresponds to the first divide operation mode and the pulse swallow signal is swallow.

The prescaler operates on the divide by 9 if the mode selection signal corresponds to the second divide operation mode and the divide oscillation frequency of the main counter corresponds to a divide-by-9 signal, operates on the divide by 8 if the mode selection signal corresponds to the second divide operation signal, the divide oscillation frequency of the main counter corresponds to a divide-by-8/10 signal and the pulse swallow signal is non-swallow, and operates on the divide by 10 if the mode selection signal corresponds to the second divide operation mode signal, the divide oscillation frequency of the main counter corresponds to the divide-by-8/10 signal, and the pulse swallow signal is swallow.

The prescaler comprises: a variable divider for dividing the oscillation frequency by 4 or 5 as pre-set in response to a swallow control signal; a double counter for double-counting a frequency from the variable divider to divide by 2; an output selector for selecting the frequency divided by 4 or 5 by the variable divider or the frequency double-counted by the double counter in response to the mode selection signal; a level converter for converting an output frequency level of the output selector into a full-swing level; and a pulse swallow controller for outputting the swallow control signal to the variable divider in response to the mode selection signal, an output of the main counter, an output of the prescaler and the pulse swallow signal of the pulse swallow counter.

The pulse swallow controller comprises: a parallel circuit having a first metal oxide semiconductor (MOS) transistor, a second MOS transistor, and a third MOS transistor connected in parallel, sources thereof commonly connected to a power, the first MOS transistor switching in response to the mode selection signal and a logical AND signal of an LSB, the second MOS transistor switching in response to the divide oscillation frequency of the main counter, and the third MOS transistor switching in response to an inverted output signal of the prescaler; a fourth MOS transistor including a source connected to a common drain of the parallel circuit and a drain connected to an output terminal, the fourth MOS transistor switching in response to the pulse swallow signal of the pulse swallow counter; a serial circuit having a fifth MOS transistor, a sixth MOS transistor and a seventh MOS transistor connected in series between a drain of the fourth MOS transistor and a ground, the fifth MOS transistor switching in response to the mode selection signal and the logical AND signal of the LSB, the sixth MOS transistor switching in response to the divide oscillation frequency of the main counter, and the seventh MOS transistor switching in response to the inverted output signal of the prescaler; and an eighth MOS transistor coupled in parallel to the serial circuit and switching in response to the pulse swallow signal of the pulse swallow counter.

According to another aspect of the invention for realizing the object, there is provided a method for dividing a frequency comprising:

(i) identifying a first divide operation mode or a second divide operation mode in response to a mode selection signal;

(ii) assigning lower 2 bits of divide data as a pulse swallow value and the other bits as a main divide ratio in the first divide operation mode, and assigning higher 2 bits out of lower 3 bits of the divide data as the pulse swallow value and remaining bits other than the lower 3 bits as the main divide ratio;

(iii) counting a clock of a main counter, and controlling a swallow if a counting value corresponds to the pulse swallow value, and a non-swallow if the counting value does not correspond to the pulse swallow value;

(iv) in the first divide operation mode, dividing an oscillation frequency by N in response to the non-swallow control and by N+1 in response to the swallow control;

(v) in the second divide operation mode, dividing the divide oscillation frequency by P if the divide oscillation frequency corresponds to a divide-by-P level, by P in response to the non-swallow control if the divide oscillation frequency corresponds to a divide-by-P/P+2 level, and by P+2 in response to the swallow control if the divide oscillation frequency corresponds to the divide-by-P/P+2 level;

(vi) selecting the frequency divided in the first divide operation mode and the second divide operation mode; and (vii) dividing the selected frequency by the main divide ratio.

In the step (i), the first divide operation mode is a 4/5 divide operation mode operating on a divide by 4 or 5, and the second divide operation mode is a 8/9/10 divide operation mode operating on a divide by 8,9 or 10.

Also, in the step (v), the divides by 4 and 5 are double-counted to divide the oscillation frequency by 9 if the mode selection signal corresponds to the second divide operation mode and the divide oscillation frequency of the main counter corresponds to a divide-by-9 level.

Further, in the step (v), the divide by 4 is double-counted to divide the oscillation frequency by 8 if the mode selection signal corresponds to the second divide operation mode signal, the divide oscillation frequency of the main counter corresponds to a divide-by-8/10 level, and the pulse swallow signal is non-swallow.

In the step (v), the divide by 5 is double-counted to divide the oscillation frequency by 10 if the mode selection signal corresponds to the second divide operation mode signal, the divide oscillation frequency of the main counter corresponds to the divide-by-8/10 level, and the pulse swallow signal is swallow.

BRIEF DESCRIPTION OF THE DRAWINGS

The above and other objects, features and other advantages of the present invention will be more clearly understood from the following detailed description taken in conjunction with the accompanying drawings, in which:

FIGS. 4(*a*) and (*b*) are time charts illustrating operation of the programmable frequency divider of FIG. 3;

DETAILED DESCRIPTION OF THE PREFERRED EMBODIMENT

Preferred embodiments of the present invention will now be described in detail with reference to the accompanying drawings in which the reference numerals are used throughout the different drawings to designate the same or similar component.

A programmable frequency divider of the invention is of a fractional-N type using a third-order sigma-delta modulator applied to a digital Mixer Oscillator Phaselocked Loop (MOPLL) tuner. At this time, the programmable frequency divider can operate at a higher comparison frequency with a lowered main divide ratio. This results in better phase noise properties and size reduction of the programmable frequency divider. Such a low divide ratio programmable frequency divider of the invention will be explained with reference to FIGS. 5 to 8.

Figure 5:
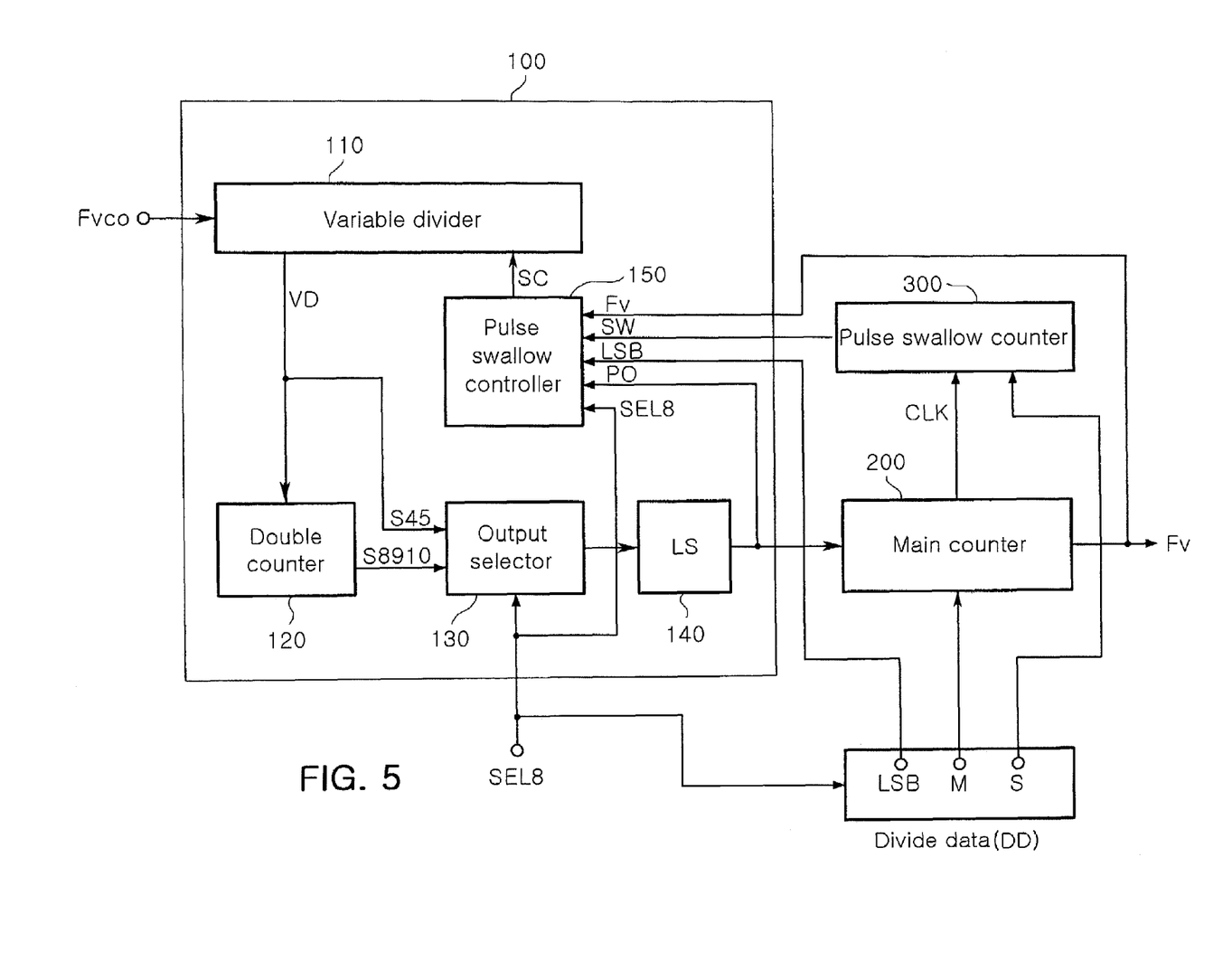
FIG. 5 is a configuration view illustrating a programmable frequency divider according to the invention.

FIG. 5 is a configuration view illustrating the programmable frequency divider of the invention.

Referring to FIG. 5, the programmable frequency divider includes a divide ratio assigner 50, a prescaler 100, a main counter 200 and a pulse swallow counter 300.

The divide ratio assigner 50 assigns divide data DD as a main divide ratio M and a pulse swallow value S according to a first divide operation mode or a second divide operation mode in response to a mode selection signal SEL8. Then, the divide ratio assigner 50 assigns 2 bits of the divide data DD as the pulse swallow value S.

For example, in the programmable frequency divider of the invention, the first divide operation mode is a divide-by-4/5 mode operating by a divide by 4 or 5 whereas the second dividing operation mode is a divide-by-8/9/10 mode operating by a divide by 8,9 or 10.

The divide ratio assigner 50 assigns lower 2 bits of the divide data DD as the pulse swallow value S and the other bits as the main divide ratio if the mode selection signal SEL8 corresponds to the first dividing operation mode. If the mode selection signal SEL8 corresponds to the second divide operation mode, the divide ratio assigner 50 assigns higher 2 bits out of lower 3 bits of the divide data DD as the pulse swallow value S and remaining bits other than the lower 3 bits as the main divide ratio M.

The prescaler 100 operates on the first divide operation mode or the second divide operation mode in response to the mode selection signal SEL8. The prescaler 100 divides an oscillation frequency Fvco by N or N+1 in response to the pulse swallow signal SW in the first divide operation mode. In the second operation mode, the prescaler 100 divides the oscillation frequency Fvco by P, P+1 or P+2 in response to a lowest bit (LSB), a divide oscillation frequency Fv, an output signal PO and the pulses swallow signal SW.

For example, in case where the divides by N and N+1 correspond to divides by 4 and 5, the prescaler 100 operates on the divide by 4 if the mode selection signal SEL8 corresponds to the first divide operation mode and the pulse swallow signal is non-swallow. The prescaler 100 also operates on the divide by 5 if the mode selection signal SEL8 corresponds to the first divide operation mode and the pulse swallow signal SW is swallow.

Further, in case where the divide by P, P+1 and P+2 corresponds to the divide by 8,9 and 10, respectively, the prescaler 100 operates on the divide by 9 if the mode selection signal SEL8 corresponds to the second divide operation mode and the divide oscillation frequency Fv of the main counter 200 corresponds to a divide-by-9 signal. The prescaler 100 operates on the divide by 8 if the mode selection signal SEL8 corresponds to the second divide operation signal, the divide oscillation frequency Fv of the main counter 200 corresponds to a divide-by-8/10 signal and the pulse swallow signal SW is non-swallow. Also, the prescaler 100 operates on the divide by 10 if the mode selection signal SEL8 corresponds to the second divide operation mode signal, the divide oscillation frequency Fv of the main counter 200 corresponds to the divide-by-8/10 signal and the pulse swallow signal SW is swallow.

To ensure such operation, the prescaler 100 can be configured variously. In one example of configuration, the prescaler 100 includes a variable divider 110 for dividing the oscillation frequency Fvco by 4 or 5 as pre-set in response to a swallow control signal SC, a double counter 120 for double-counting a frequency from the variable divider 110 to divide by 2; an output selector 130 for selecting the frequency Fvco/4 or Fvco/5 divided by 4 or 5 by the variable divider 110 or the frequency Fvco/8 or Fvco/9 or Fvco/10 double-counted by the double counter 31c in response to the mode selection signal SEL8, a level converter 140 for converting an output frequency level of the output selector into a full-swing level, and a pulse swallow controller 150 for outputting the swallow control signal SW to the variable divider 110 in response to the mode selection signal SEL, an output Fv of the main counter, an output signal PO of the prescaler and the pulse swallow signal SC of the pulse swallow counter 300.

The main counter 200 divides a frequency from the prescaler 100 by the main divide ratio M.

The pulse swallow counter 300 counts a clock of the main counter 200 while outputting the pulse swallow signal SW to the prescaler 100. The pulse swallow signal SW has a swallow level if a counting value corresponds to the pulse swallow value S and a non-swallow signal if the counting value does not correspond to the pulse swallow value S.

Figure 6:
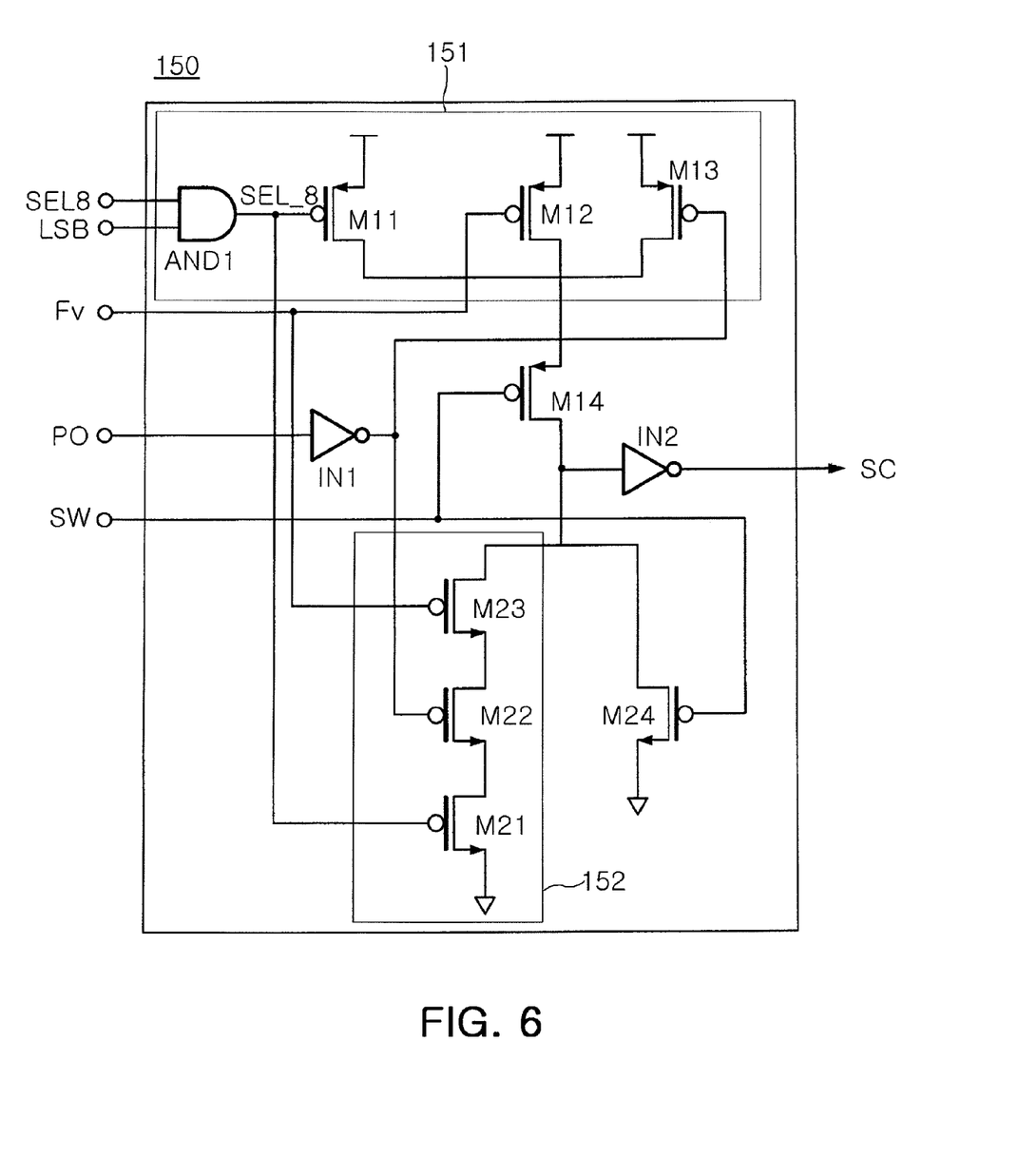
FIG. 6 is a configuration view illustrating a pulse swallow controller of FIG. 5.

FIG. 6 is a configuration view illustrating the pulse swallow controller of FIG. 6.

Referring to FIG. 6, the pulse swallow controller 150 includes a parallel circuit 151, a fourth MOS transistor M14, a serial circuit 152 and an eighth MOS transistor M24.

The parallel circuit 151 has a first metal oxide semiconductor (MOS) transistor M11, a second MOS transistor M12 and a third MOS transistor M13 connected in parallel, sources thereof commonly connected to a power. The first MOS transistor M11 switches in response to the mode selection signal SEL8 and a logical AND signal of an LSB. The second MOS transistor M12 switches in response to the divide oscillation frequency of the main counter 200. The third MOS transistor M13 switches in response to an inverted signal $\overline{PO}$ of the output PO of the prescaler 100.

Also, the parallel circuit 151 includes an AND gate AND1 for logically multiplying the mode selection signal SEL8 by the LSB.

The fourth MOS transistor M14 includes a source connected to a common drain of the parallel circuit 151 and a drain connected to an output terminal. The fourth MOS transistor switches in response to the pulse swallow signal SW of the pulse swallow counter 300.

The serial circuit 152 has a fifth MOS transistor M21, a sixth MOS transistor M14 and a seventh MOS transistor M23 connected in series between a drain of the fourth MOS transistor M14 and a ground. The fifth MOS transistor M21 switches in response to the mode selection signal SEL8 and the logical AND of the LSB. The sixth MOS transistor M22 switches in response to the divide oscillation frequency Fv of the main counter 200. The seventh MOS transistor M23 switches in response to the inverted output signal $\overline{PO}$ of the prescaler 100.

The eight transistor M24 is connected in parallel to the serial circuit 152 and switches in response to the pulse swallow signal SW of the pulse swallow counter 300.

Herein, the first to fourth MOS transistors M11-M14 correspond to an N channel and signals inputted to each gate are invert-inputted. Further, the fifth to eight MOS transistors M21-M24 correspond to a P channel.

Figure 7:
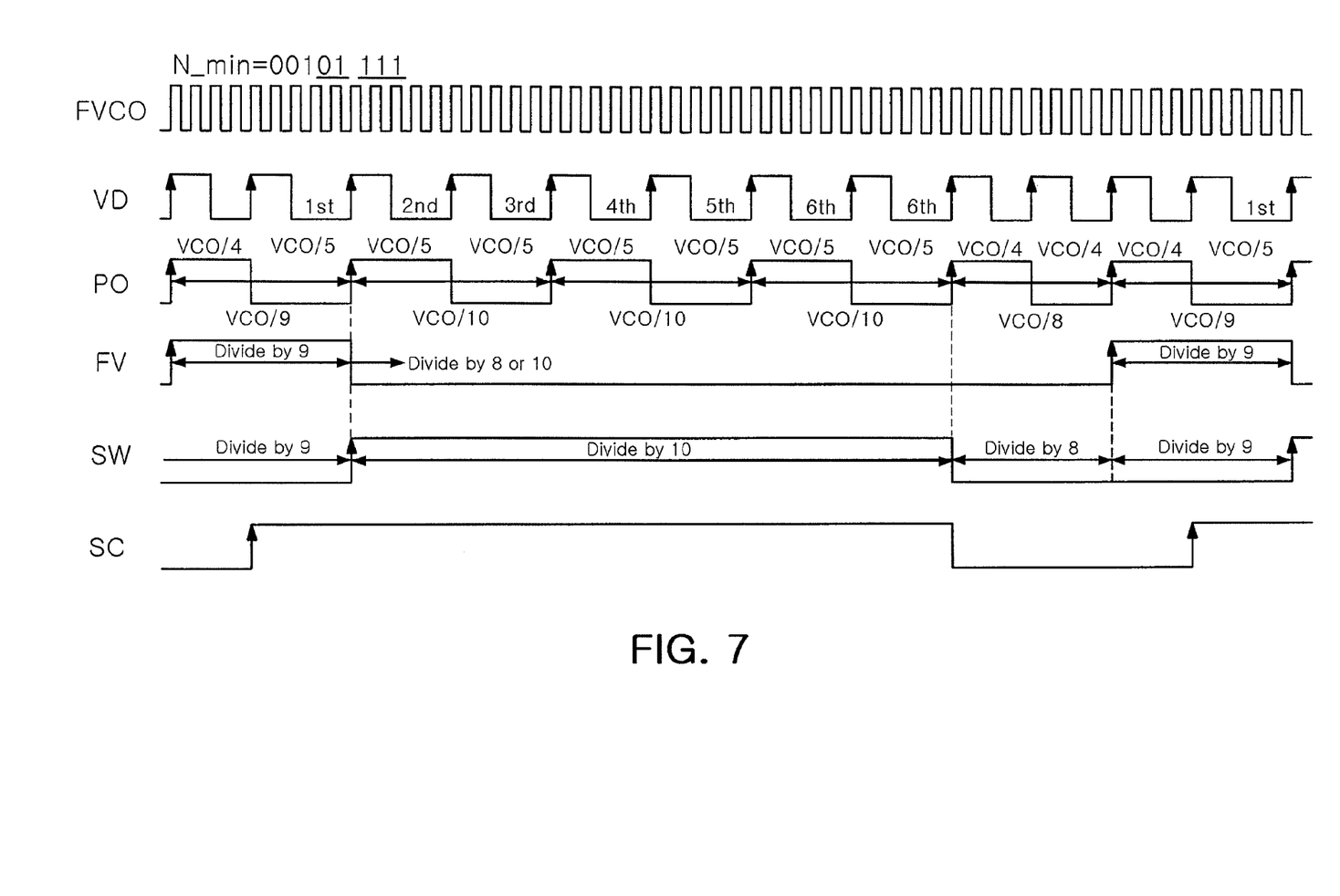
FIG. 7 is a time chart illustrating operation of the programmable frequency divider of the invention.

FIG. 7 is a time chart illustrating operation of a programmable frequency divider of the invention.

In FIG. 7, Fvco is a waveform of an oscillation frequency to be divided. VD is a waveform of a frequency divided by the variable divider 110. PO is a waveform of an output frequency divided by the prescaler 100. Fv is a frequency divided by the programmable frequency divider of the invention. SW is a pulse swallow signal provided by the pulse swallow counter 300. In addition, SC is a swallow control signal outputted from the pulse swallow controller 150.

Figure 8:
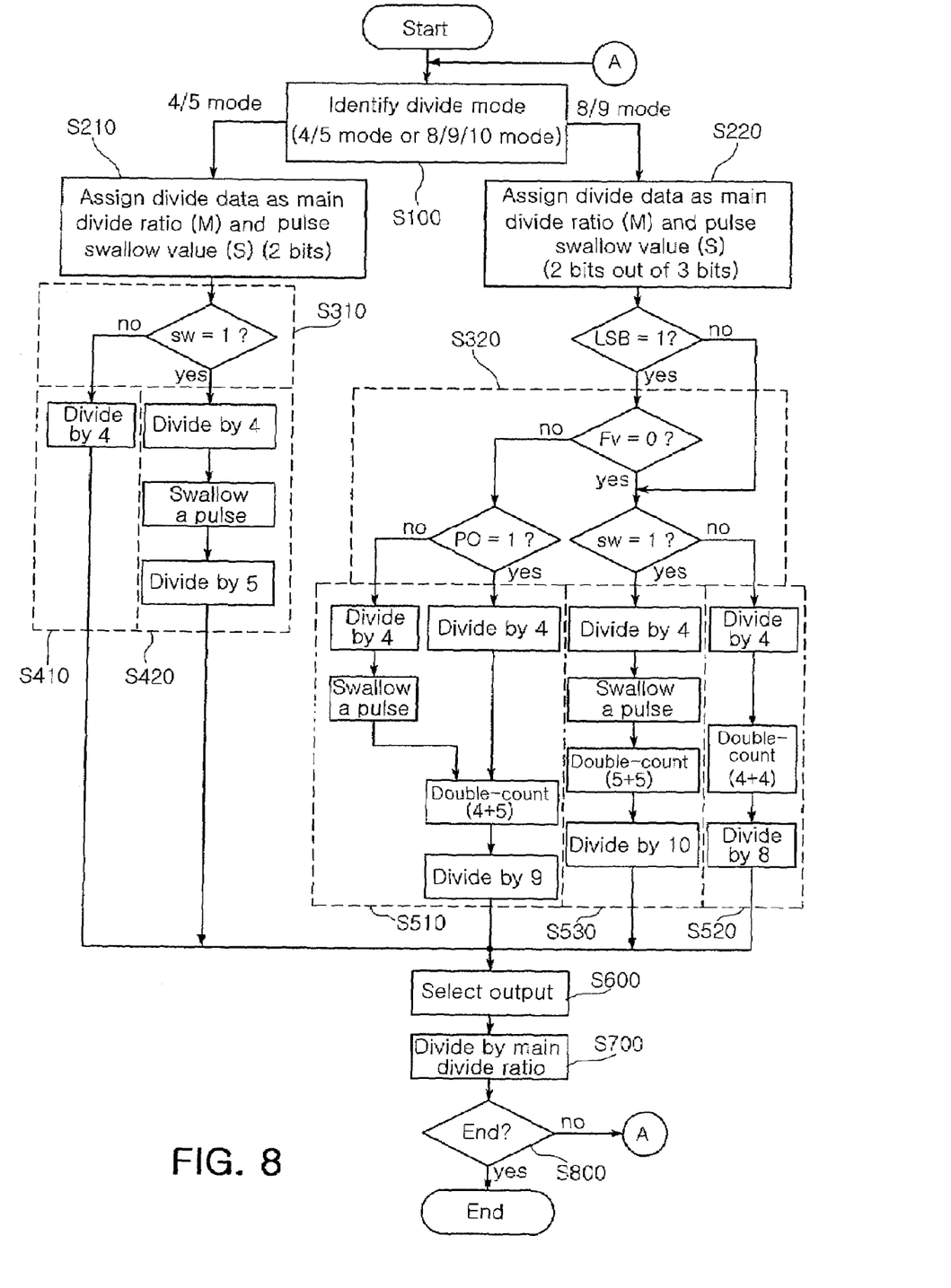
FIG. 8 is a flowchart illustrating a method for dividing a frequency according to the invention.

FIG. 8 is a flowchart illustrating a method for dividing a frequency of the invention, which illustrates a divide operation of a programmable frequency divider of the invention.

Operation and effects of the invention will be explained hereunder in greater detail with reference to the accompanying drawings.

The programmable frequency divider of the invention divides an oscillation frequency Fvco by 4/5 or 8/9/10. In case of the divide by 8/9/10, 2 bits out of lower 3 bits of divide data DD are assigned as a swallow value S and remaining bits other than the lower 3 bits are assigned as a main divide ratio M. This allows the programmable frequency divider to operate at a high comparison frequency with a lowered divide ratio. Operation of the programmable frequency divider of the invention will be explained with reference to FIGS. 5 to 8.

Referring to FIGS. 5 to 8, first, a first divide operation mode or a second divide operation mode is identified in response to a mode selection signal SEL8 in S100. At this time, if the mode selection signal SEL8 corresponds to a low level '0', the programmable frequency divider operates on the first divide operation mode, whereas if the mode selection signal SEL8 corresponds to a high level '1', the programmable frequency divider operates on the second divide operation mode.

Here, in S100, the first divide operation mode corresponds to a divide-by-4/5 mode operating on a divide by 4 or 5. The second divide operation mode corresponds to a divide-by-8/9/10 mode operating on a divide by 8,9 or 10.

Then, lower 2 bits of divide data DD are assigned as a pulse swallow value S in the first divide operation mode, and the other bits are assigned as a main divide ratio M in step 210. In the second divide operation mode, higher 2 bits out of lower 3 bits of the divide data DD are assigned as the pulse swallow value S and remaining bits other than the lower 3 bits are assigned as the main divide ratio M in step 220.

This is executed by a divide ratio assigner 50 of the invention. For example, in the first dividing operation mode, if the divide data DD is "0001 0100", the divide ratio assigner 50 of the invention assigns lower 2 bits "00" of the divide data DD to the pulse swallow counter 300 as the pulse swallow value S and the other bits "0001 01" to the main counter 200 as the main divide ration M.

In the second dividing operation mode, if the divide data DD is "0010 1000", the divide ratio assigner 50 assigns higher 2 bits "00" out of lower 3 bits "000" of the divide data DD to the pulse swallow counter 300 as the pulse swallow value S and remaining bits "0010 1" other than the lower 3 bits "000" to the main counter 200 as the main divide ratio M.

Thereafter, while a clock CLK of the main counter 200 is counted, a swallow is controlled if a counting value corresponds to the pulse swallow value S in S310. If the counting value does not correspond to the pulse swallow value, a non-swallow is controlled.

That is, the pulse swallow counter 300 of the invention counts the clock CLK of the main counter 200 while outputting the pulse swallow signal SW to the prescaler 100. The pulse swallow signal SW has a swallow level if the counting value corresponds to the pulse swallow value S, and a non-swallow level if the counting value does not correspond to the pulse swallow value S.

The prescaler 100 of the invention executes a divide operation in response to the pulse swallow signal SW as shown in Table 1 below.

TABLE 1

| | SEL8 | LSB | Fv | PO | SW | SC | Divide |
|---|---|---|---|---|---|---|---|
| First divide operation mode | 0 | X | X | X | 0 | 0 | 4 |
| (divide by 4 or 5) | 0 | X | X | X | 1 | 1 | 5 |
| Second divide | 1 | 0 | X | X | 0 | 0 | 8 |
| operation mode | 1 | 0 | X | X | 0 | 0 | |
| (divide by 8, 9 or 10) | 1 | 0 | X | X | 1 | 1 | 10 |
| | 1 | 0 | X | X | 1 | 1 | |
| | 1 | 1 | 1 | 0 | 0 | 0 | 9 |
| | 1 | 1 | 1 | 1 | 0 | 1 | |
| | 1 | 1 | 0 | 0 | 1 | 1 | 10 |
| | 1 | 1 | 0 | 1 | 1 | 1 | |
| | 1 | 1 | 0 | 0 | 0 | 0 | 8 |
| | 1 | 1 | 0 | 1 | 0 | 0 | |

Referring to FIG. 1, the prescaler 100 operates on a divide by 4 or 5 if the mode selection signal SEL8 corresponds to a low level '0'. At this time, the prescaler 100 operates on the divide by 4 if the pulse swallow signal SW corresponds to a low level '0'. If the pulse swallow signal SW corresponds to a high level '1', the prescaler 100 operates on the divide by 5.

In addition, the prescaler 100 operates on a divide by 8,9, or 10 if the mode selection signal SEL8 corresponds to a high level '1'. At this time, the prescaler 100 operates on the divide by 9 if an output Fv of the main counter 200 of the invention corresponds to a high level '1'. The prescaler 100 operates on the divide by 8 or 10 if the output Fv of the main counter 200 corresponds to a low level '0'. Specifically, the prescaler 100 operates on the divide by 8 if the pulse swallow signal SW corresponds to a low level '0'. The prescaler 100 operates on the divide by 10 if the pulse swallow signal SW corresponds to a high level '1'.

Thereafter, in the first divide operation mode, an oscillation frequency Fvco is divided by N or N+1 in response to the pulse swallow signal SW in S410 and S420. For example, in case where the divide by N or N+1 corresponds to a divide by 4 or 5, respectively, the oscillation frequency Fvco is divided by 4 if the pulse swallow signal SW corresponds to a low level '0'. The oscillation frequency Fvco is divided by 5 if the pulse swallow signal SW corresponds to a high level "1".

That is, in case where the first divide operation mode corresponds to a divide-by-4/5 operation mode, a variable divider 110 of the prescaler 100 operates on the divide by 4 if the mode selection signal SEL8 corresponds to the first divide operation mode (e.g. low level) and the pulse swallow signal SW is non-swallow (e.g. low level). The variable divider 110 operates on the divide by 5 if the mode selection signal SEL8 corresponds to the first divide operation mode signal (e.g. low level) and the pulse swallow signal SW is swallow (e.g. high level).

With regard to the divide D by 5, the variable divider 110 divides the oscillation frequency Fvco by 4, and then swallows a pulse from the frequency signals divided by 4 in response to the swallow control signal SC of the pulse swallow controller 150 of the invention to divide by 5.

Thereafter, an output selector 130 of the prescaler 100 selects the frequency Fvco/4 divided by 4 by or the frequency Fvco/4 divided by 5 by the variable divider and outputs the same to the main counter 200 through the level converter 140.

Next, in the second divide operation mode, the divide oscillation frequency Fv is divided by P if the divide oscillation frequency FV corresponds to a divide-by-P level, by P in response to the non-swallow control if the divide oscillation frequency Fv corresponds to a divide-by-P/P+2 level and by P+2 in response to the swallow control if the dividing oscillation frequency Fv corresponds to the divide-by-P/P+2 level in S510, S520 and S530.

For example, an explanation will be given in greater detail regarding in case where the second divide operation mode corresponds to a divide by-8/9/10 operation mode.

First, with regard to a process of the divide by 9, the variable divider 110 of the prescaler 100, in S510, successively executes the divide by 4 or 5 if the divide oscillation frequency Fv of the main counter 200 corresponds to a divide-by-9 level. If the mode selection signal SEL8 corresponds to the second divide operation mode, the double counter 120 double-counts (divide by 4 and 5) the frequency divided by 4 or 5 by the variable divider 110 to divide the oscillation frequency Fvco by 9 as shown in FIG. 7.

Further, with regard to a process of the divide by 8, the variable divider 110 of the prescaler 100, in S520, successively executes divides by 4 and 4 if the divide oscillation frequency Fv of the main counter 200 corresponds to a divide-by-8/10 level and the pulse swallow signal SW is non-swallow. If the mode selection signal SEL8 corresponds to the second divide operation mode signal, the double counter 120 double-counts (divides by 4+4) the divides by 4 and 4 to divide the oscillation frequency Fvco by 8 as shown in FIG. 7.

Also, with regard to a process of the divide by 10, the variable divider 110, in S520, successively executes divides by 5 and 5 if the divide oscillation frequency Fv of the main counter 200 corresponds to a divide-by-8/10 level for the divide by 8 or 10 mode, and the pulse swallow signal SW is swallow. If the mode selection signal SEL8 corresponds to the second divide operation mode, the double counter 120 double-counts (divides by 5+5) the divides by 5 and 5 to divide the oscillation frequency Fvco by 10 as shown in FIG. 7.

The pulse swallow controller 150 will be explained with reference to FIG. 6.

The pulse swallow controller 150 operates as shown in FIG. 1. In a brief explanation of a circuit of FIG. 6, a fourth transistor M14 switches in response to the pulse swallow signal SW. Thus, the swallow control signal SC of the pulse swallow controller 150 is decided by the pulse swallow signal SW. Exceptionally, in case of a divide by 9, if the fourth transistor M14 is turned on by the pulse swallow signal SW, first to third MOS transistors M11-M13 of the parallel circuit 151 are turned off. Therefore, the swallow control signal SC is inputted as a high level having a low level inverted.

Then, in S600, the frequency divided in S410,S420 and S510,S520,S530 is selected.

In a detailed explanation, the output selector of the invention 130 selects the frequency divided by 4 or 5 by the variable divider 110 or the frequency double-counted (divided by 8,9 or 10) by the double counter 120.

Thereafter, in S700, the selected frequency is divided by the main divide ratio M. That is, the main counter 200 of the invention divides a frequency from the prescaler 100 by the main divide ratio.

As described above, the invention can decrease a main divide ratio, and a swallow value from conventional 3 bits to 2 bits in a divide-by-8/9/10 operation mode. Consequently, this enables a programmable frequency divider to operate at high comparison frequency, thereby improving phase noise properties and facilitating size reduction thereof.

As stated above, the invention allows a low divide ratio programmable frequency divider of a factional-N type applied to a digital MOPLL tuner to operate at a high frequency with a lowered main divide ratio. As a result, this improves phase noise properties of the low divide ratio programmable frequency divider and reduces the size thereof.

While the present invention has been shown and described in connection with the preferred embodiments, it will be apparent to those skilled in the art that modifications and variations can be made without departing from the spirit and scope of the invention as defined by the appended claims.

What is claimed is:

1. A low divide ratio programmable frequency divider comprising:
   a divide ratio assigner for assigning divide data as a main divide ratio and a pulse swallow value according to a first divide operation mode or a second divide operation mode in response to a mode selection signal, wherein 2 bits of the divide data are assigned as the pulse swallow value;
   a prescaler for operating on the first divide operation mode or the second divide operation mode in response to the mode selection signal, dividing an oscillation frequency by N or N+1 in response to a pulse swallow signal in the first divide operation mode, and dividing the oscillation frequency by P, P+1 or P+2 in response to a lowest bit, a divide oscillation frequency, an output signal thereof and the pulse swallow signal in the second operation mode;
   a main counter for dividing a frequency from the prescaler by the main divide ratio; and
   a pulse swallow counter for counting a clock of the main counter while outputting the pulse swallow signal to the prescaler, the pulse swallow signal having a swallow level if a counting value corresponds to the pulse swallow value, and having a non-swallow level if the counting value does not correspond to the pulse swallow value.

2. The low divide ratio programmable frequency divider according to claim 1, wherein the first divide operation mode comprises a 4/5 divide operation mode operating on a divide by 4 or 5, and the second divide operation mode comprises an 8/9/10 divide operation mode operating on a divide by 8, 9, or 10.

3. The low divide ratio programmable frequency divider according to claim 1, wherein the divide ratio assigner is configured to:
   assign lower 2 bits of the divide data as the pulse swallow value and the other bits as the main divide ratio if the mode selection signal corresponds to the first divide operation mode; and
   assign higher 2 bits out of lower 3 bits of the divide data as the pulse swallow value and remaining bits other than the lower 3 bits as the main divide ratio if the mode selection signal corresponds to the second divide operation mode.

4. The low divide ratio programmable frequency divider according to claim 3, wherein the prescaler operates on the divide by 4 if the mode selection signal corresponds to the first divide operation mode and the pulse swallow signal is non-swallow, and operates on the divide by 5 if the mode selection signal corresponds to the first divide operation mode and the pulse swallow signal is swallow.

5. The low divide ratio programmable frequency divider according to claim 3, wherein the prescaler operates on the divide by 9 if the mode selection signal corresponds to the second divide operation mode and the divide oscillation frequency of the main counter corresponds to a divide-by-9 signal, operates on the divide by 8 if the mode selection signal corresponds to the second divide operation signal, the divide oscillation frequency of the main counter corresponds to a divide-by-8/10 signal and the pulse swallow signal is non-swallow, and operates on the divide by 10 if the mode selection signal corresponds to the second divide operation mode signal, the divide oscillation frequency of the main counter corresponds to the divide-by-8/10 signal, and the pulse swallow signal is swallow.

6. The low divide ratio programmable frequency divider according to claim 3, wherein the prescaler comprises:
   a variable divider for dividing the oscillation frequency by 4 or 5 as pre-set in response to a swallow control signal;
   a double counter for double-counting a frequency from the variable divider to divide by 2;
   an output selector for selecting the frequency divided by 4 or 5 by the variable divider or the frequency double-counted by the double counter in response to the mode selection signal;
   a level converter for converting an output frequency level of the output selector into a full-swing level; and
   a pulse swallow controller for outputting the swallow control signal to the variable divider in response to the mode selection signal, an output of the main counter, an output signal of the prescaler and the pulse swallow signal of the pulse swallow counter.

7. The low divide ratio programmable frequency divider according to claim 6, wherein the pulse swallow controller comprises:
   a parallel circuit having a first metal oxide semiconductor (MOS) transistor, a second MOS transistor, and a third MOS transistor connected in parallel, sources thereof commonly connected to a power, the first MOS transistor switching in response to the mode selection signal and a logical AND signal of an LSB, the second MOS transistor switching in response to the divide oscillation frequency of the main counter, and the third MOS transistor switching in response to an inverted output signal of the prescaler;
   a fourth MOS transistor including a source connected to a common drain of the parallel circuit and a drain connected to an output terminal, the fourth MOS transistor switching in response to the pulse swallow signal of the pulse swallow counter;
   a serial circuit having a fifth MOS transistor, a sixth MOS transistor and a seventh MOS transistor connected in series between a drain of the fourth MOS transistor and a ground, the fifth MOS transistor switching in response to the mode selection signal and the logical AND signal of the LSB, the sixth MOS transistor switching in response to the divide oscillation frequency of the main counter, and the seventh MOS transistor switching in response to the inverted output signal of the prescaler; and
   an eighth MOS transistor connected in parallel to the serial circuit and switching in response to the pulse swallow signal of the pulse swallow counter.

8. The low divide ratio programmable frequency divider according to claim 2, wherein the divide ratio assigner is configured to:
   assign lower 2 bits of the divide data as the pulse swallow value and the other bits as the main divide ratio if the mode selection signal corresponds to the first divide operation mode; and
   assign higher 2 bits out of lower 3 bits of the divide data as the pulse swallow value and remaining bits other than the lower 3 bits as the main divide ratio if the mode selection signal corresponds to the second divide operation mode.

9. The low divide ratio programmable frequency divider according to claim 8, wherein the prescaler operates on the divide by 4 if the mode selection signal corresponds to the first divide operation mode and the pulse swallow signal is non-swallow, and operates on the divide by 5 if the mode selection signal corresponds to the first divide operation mode and the pulse swallow signal is swallow.

10. The low divide ratio programmable frequency divider according to claim 8, wherein the prescaler operates on the divide by 9 if the mode selection signal corresponds to the second divide operation mode and the divide oscillation frequency of the main counter corresponds to a divide-by-9 signal, operates on the divide by 8 if the mode selection signal corresponds to the second divide operation signal, the divide oscillation frequency of the main counter corresponds to a divide-by-8/10 signal and the pulse swallow signal is non-swallow, and operates on the divide by 10 if the mode selection signal corresponds to the second divide operation mode signal, the divide oscillation frequency of the main counter corresponds to the divide-by-8/10 signal, and the pulse swallow signal is swallow.

11. The low divide ratio programmable frequency divider according to claim 8, wherein the prescaler comprises:
   a variable divider for dividing the oscillation frequency by 4 or 5 as pre-set in response to a swallow control signal;
   a double counter for double-counting a frequency from the variable divider to divide by 2;
   an output selector for selecting the frequency divided by 4 or 5 by the variable divider or the frequency double-counted by the double counter in response to the mode selection signal;
   a level converter for converting an output frequency level of the output selector into a full-swing level; and
   a pulse swallow controller for outputting the swallow control signal to the variable divider in response to the mode selection signal, an output of the main counter, an output of the prescaler and the pulse swallow signal of the pulse swallow counter.

12. The low divide ratio programmable frequency divider according to claim 11, wherein the pulse swallow controller comprises:
   a parallel circuit having a first metal oxide semiconductor (MOS) transistor, a second MOS transistor, and a third MOS transistor connected in parallel, sources thereof commonly connected to a power, the first MOS transistor switching in response to the mode selection signal and a logical AND signal of an LSB, the second MOS transistor switching in response to the divide oscillation frequency of the main counter, and the third MOS transistor switching in response to an inverted output signal of the prescaler;
   a fourth MOS transistor including a source connected to a common drain of the parallel circuit and a drain connected to an output terminal, the fourth MOS transistor switching in response to the pulse swallow signal of the pulse swallow counter;
   a serial circuit having a fifth MOS transistor, a sixth MOS transistor and a seventh MOS transistor connected in series between a drain of the fourth MOS transistor and a ground, the fifth MOS transistor switching in response to the mode selection signal and the logical AND signal of the LSB, the sixth MOS transistor switching in response to the divide oscillation frequency of the main counter, and the seventh MOS transistor switching in response to the inverted output signal of the prescaler; and
   an eighth MOS transistor coupled in parallel to the serial circuit and switching in response to the pulse swallow signal of the pulse swallow counter.

13. A method for dividing a frequency comprising:
(i) identifying a first divide operation mode or a second divide operation mode in response to a mode selection signal;
(ii) assigning lower 2 bits of divide data as a pulse swallow value and the other bits as a main divide ratio in the first divide operation mode, and assigning higher 2 bits out of lower 3 bits of the divide data as the pulse swallow value and remaining bits other than the lower 3 bits as the main divide ratio in the second divide operation mode;
(iii) counting a clock of a main counter, and controlling a swallow if a counting value corresponds to the pulse swallow value, and a non-swallow if the counting value does not correspond to the pulse swallow value;
(iv) in the first divide operation mode, dividing an oscillation frequency by N in response to a non-swallow control and by N+1 in response to a swallow control;
(v) in the second divide operation mode, dividing the divide oscillation frequency by P if the divide oscillation frequency corresponds to a divide-by-P level, by P in response to the non-swallow control if the divide oscillation frequency corresponds to a divide-by-P/P+2 level, and by P+2 in response to the swallow control if the divide oscillation frequency corresponds to the divide-by-P/P+2 level;
(vi) selecting the frequency divided in the first divide operation mode and the second divide operation mode; and
(vii) dividing the selected frequency by the main divide ratio.

14. The method according to claim 13, wherein in the step (i), the first divide operation mode is a 4/5 divide operation mode operating on a divide by 4 or 5, and the second divide operation mode is a 8/9/10 divide operation mode operating on a divide by 8, 9 or 10.

15. The method according to claim 13, wherein in the step (v), the divides by 4 and 5 are double-counted to divide the oscillation frequency by 9 if the mode selection signal corresponds to the second divide operation mode and the divide oscillation frequency of the main counter corresponds to a divide-by-9 level.

16. The method according to claim 13, wherein in the step (v), the divide by 4 is double-counted to divide the oscillation frequency by 8 if the mode selection signal corresponds to the second divide operation mode signal, the divide oscillation frequency of the main counter corresponds to a divide-by-8/10 level, and the pulse swallow signal is non-swallow.

17. The method according to claim 13, wherein in the step (v), the divide by 5 is double-counted to divide the oscillation frequency by 10 if the mode selection signal corresponds to the second divide operation mode signal, the divide oscillation frequency of the main counter corresponds to the divide-by-8/10 level, and the pulse swallow signal is swallow.

* * * * *